United States Patent
Oh et al.

(10) Patent No.: US 12,415,955 B2
(45) Date of Patent: Sep. 16, 2025

(54) ETCHANT COMPOSITION FOR SILICON LAYER AND ETCHING METHOD USING THE SAME

(71) Applicant: ENF TECHNOLOGY CO., LTD., Yongin-si (KR)

(72) Inventors: Jeong Sik Oh, Yongin-si (KR); Hak Soo Kim, Yongin-si (KR); Gi Young Kim, Yongin-si (KR); Myung Ho Lee, Yongin-si (KR); Myung Geun Song, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 295 days.

(21) Appl. No.: 18/068,888

(22) Filed: Dec. 20, 2022

(65) Prior Publication Data
US 2024/0199953 A1    Jun. 20, 2024

(30) Foreign Application Priority Data
Oct. 14, 2022    (KR) .......................... 10-2022-0132034

(51) Int. Cl.
*C09K 13/08* (2006.01)
*H01L 21/306* (2006.01)

(52) U.S. Cl.
CPC ........ *C09K 13/08* (2013.01); *H01L 21/30604* (2013.01)

(58) Field of Classification Search
None
See application file for complete search history.

(56) References Cited

U.S. PATENT DOCUMENTS

| 2008/0041823 A1* | 2/2008 | La ..................... H01L 21/31111 252/79.3 |
| 2010/0216315 A1* | 8/2010 | Yaguchi ............ H01L 21/32134 252/79.2 |
| 2024/0103377 A1* | 3/2024 | Chen ....................... C09K 13/04 |

FOREIGN PATENT DOCUMENTS

KR    20180047816 A    5/2018

\* cited by examiner

*Primary Examiner* — Shamim Ahmed
(74) *Attorney, Agent, or Firm* — McCoy Russell LLP

(57) ABSTRACT

Provided is an etchant composition for a silicon layer including: a fluoride-based compound; a nitrate-based compound; an acid mixture including a phosphoric acid-based inorganic acid and an organic acid; and a nitrosyl compound and capable of selectively etching the silicon layer with respect to a silicon oxide layer.

11 Claims, No Drawings

ETCHANT COMPOSITION FOR SILICON LAYER AND ETCHING METHOD USING THE SAME

CROSS-REFERENCE TO RELATED APPLICATIONS

This application claims priority under 35 U.S.C. § 119 to Korean Patent Application No. 10-202-0132034, filed on Oct. 14, 2022, in the Korean Intellectual Property Office, the disclosure of which is incorporated herein by reference in its entirety.

TECHNICAL FIELD

The following disclosure relates to an etchant composition for a silicon layer in which an etch selectivity of the silicon layer (Si) to a silicon oxide layer ($SiO_2$) is excellent and an etching method of a silicon layer using the same.

BACKGROUND

In a semiconductor or thin film display manufacturing process, polysilicon and a silicon layer are used in order to form metal wirings and gate elements in designing an electrical circuit, and a process of selectively removing the polysilicon and the silicon layer to etch the polysilicon and the silicon layer in a predetermined form is required.

However, an etching method for a silicon layer according to the related art has a problem in that a lower metal layer may be exposed and a metal element may be damaged due to etching performance even for a silicon oxide layer ($SiO_2$), which is a main insulating layer of a semiconductor.

In order to solve such a problem, a method of adding a metal layer corrosion inhibitor has been proposed, but an effect of such a method is not sufficient and a fundamental problem such as damage to the insulating layer such as the silicon oxide layer might not be solved. In addition, a method of reducing a contact time of an etchant by adjusting a process condition rather than a composition of the etchant has been proposed, but such a method may adversely bring about a problem such as an unetch defect of the silicon layer, and thus, has a limitation that it may affect a subsequent process.

RELATED ART DOCUMENT

Patent Document

Korean Patent Laid-Open Publication No. 10-2018-0047816 (published on May 10, 2018)

SUMMARY

An embodiment of the present disclosure is directed to providing an etchant composition for a silicon layer capable of having a very low etch rate for a silicon oxide layer and selectively etching only the silicon layer, and an etching method using the same.

In one general aspect, an etchant composition for a silicon layer includes: a fluoride-based compound; a nitrate-based compound; an acid mixture including a phosphoric acid-based inorganic acid and an organic acid; and a nitrosyl compound.

The nitrate-based compound may be included in an amount of 70 wt % to 90 wt % based on a total weight of the etchant composition for a silicon layer.

The etchant composition for a silicon layer may include 1 to 10 parts by weight of the fluoride-based compound, 5 to 20 parts by weight of the phosphoric acid-based inorganic acid, and 5 to 20 parts by weight of the organic acid based on 100 parts by weight of the nitrate-based compound.

The nitrosyl compound may be included in an amount of 0.01 to 10 wt % based on the total weight of the etchant composition for a silicon layer.

The fluoride-based compound may be hydrofluoric acid (HF), ammonium bifluoride ($NH_4HF_2$), ammonium fluoride ($NH_4F$), sodium fluoride (NaF), potassium fluoride (KF), aluminum fluoride ($AlF_3$), fluorboric acid ($HBF_4$), sodium bifluoride ($NaHF_2$), potassium bifluoride ($KHF_2$), ammonium tetrafluoroborate ($NH_4BF_4$), or combinations thereof.

The nitrosyl compound may be nitrosonium hexafluorophosphate ($NOPF_6$), nitrosyl tetrafluoroborate ($NOBF_4$), nitrosyl sulfuric acid ($NOHSO_4$), ruthenium(III) nitrosyl chloride ($Ru(NO)Cl_3$), nitrosyl chloride (NOCl), nitronium tetrafluoroborate ($NO_2BF_4$), nitronium hexafluorophosphate ($NO_2PF_6$), nitronium hydrogen sulfate ($NO_2HSO_4$), or combinations thereof.

The nitrate-based compound may be nitric acid ($HNO_3$), peroxynitric acid ($HNO_4$), or combinations thereof.

The nitric acid may be high concentration nitric acid having a concentration of 68% or more.

An etch rate for the silicon layer (Si) may be 5 μm/min or more, and an etch selectivity of the silicon layer (Si) to a silicon oxide layer ($SiO_2$) may be 400 or more.

In another general aspect, there is provided an etching method of selectively etching a silicon layer with respect to a silicon oxide layer using the etchant composition for a silicon layer as described above.

In still another aspect, a method of manufacturing a semiconductor element includes an etching process performed using the etchant composition for a silicon layer as described above.

DETAILED DESCRIPTION OF EMBODIMENTS

Unless defined otherwise herein, all technical and scientific terms have the same meanings as the meanings generally understood by those skilled in the art to which the present disclosure belongs. The terms as used herein are used only for the purpose of effectively describing specific embodiments and are not intended to limit the disclosure.

Singular forms of the terms as used herein may be intended to include plural forms unless otherwise indicated in the context.

In addition, numerical ranges as used herein include lower and upper limits and all values within these ranges, increments logically derived from forms and widths of defined ranges, all values doubly defined, and all possible combinations of upper and lower limits of numerical ranges defined in different forms. Unless specifically defined otherwise herein, values outside the numerical ranges that may occur due to experimental errors or round-off of values are also included in the defined numerical ranges.

As used herein, the term "include" is an open-ended description having an equivalent meaning to an expression such as "comprise", "contain", "have", or "characterized by", and does not exclude elements, materials, or processes that are not additionally mentioned.

As used herein, the term "etch selectivity ($E_{Si}/E_{SiO2}$)" refers to a ratio of an etch rate ($E_{Si}$) of a silicon layer to an etch rate ($E_{SiO2}$) of a silicon oxide layer, and means that the greater the value of the etch selectivity, the more selectively the silicon layer may be etched.

An embodiment of the present disclosure provides an etchant composition for a silicon layer in which an etch selectivity of the silicon layer (Si) to a silicon oxide layer (SiO$_2$) is excellent.

An etchant composition for a silicon layer according to an embodiment includes a fluoride-based compound; a nitrate-based compound; an acid mixture including a phosphoric acid-based inorganic acid and an organic acid; and a nitrosyl compound.

The nitrate-based compound may serve as an oxidizing agent oxidizing a silicon layer and is not limited as long as it is any acidic material including a nitrate group (NO$_3^-$), and, for example, nitric acid (HNO$_3$), peroxynitric acid (HNO$_4$), or combinations thereof may be used as the nitrate-based compound. The nitric acid may be high concentration nitric acid having a concentration of 68% or more, and may be specifically fuming nitric acid or concentrated nitric acid, but is not necessarily limited thereto.

In addition, the nitrate-based compound may be included in an amount of 70 wt % or more, and specifically 70 wt % to 90 wt % or 70 wt % to 80 wt %, based on the total weight of the etchant composition for a silicon layer. In a case where the above-described range is satisfied, when the nitrate-based compound is combined with other components, an etch rate for the silicon layer may be further improved while minimizing damage to the silicon oxide layer.

The fluoride-based compound may serve as an etchant etching the silicon layer and is not limited as long as it is any material including a fluoride group (—F), and, for example, hydrofluoric acid (HF), ammonium bifluoride (NH$_4$HF$_2$), ammonium fluoride (NH$_4$F), sodium fluoride (NaF), potassium fluoride (KF), aluminum fluoride (AlF$_3$), fluorboric acid (HIBF$_4$), sodium bifluoride (NaIF$_2$), potassium bifluoride (KHF$_2$), ammonium tetrafluoroborate (NH$_4$BF$_4$), or combinations thereof may be used as the fluoride-based compound. More specifically, the fluoride-based compound may be an acidic material including a fluoride group, and may be hydrofluoric acid (HF), ammonium bifluoride (NH$_4$HF$_2$), or combinations thereof.

The nitrosyl compound may serve as an oxidizing aid to help oxidize the silicon layer and is not limited as long as it is any material including a nitrosyl group (—N=O), and, for example, nitrosonium hexafluorophosphate (NOPF$_6$), nitrosyl tetrafluoroborate (NOBF$_4$), nitrosyl sulfuric acid (NOHSO$_4$), ruthenium(III) nitrosyl chloride (Ru(NO)Cl$_3$), nitrosyl chloride (NOCl), nitronium tetrafluoroborate (NO$_2$BF$_4$), nitronium hexafluorophosphate (NO$_2$PF$_6$), nitronium hydrogen sulfate (NO$_2$HSO$_4$), or combinations thereof, and more specifically, nitrosonium hexafluorophosphate (NOPF$_6$), nitrosyl tetrafluoroborate (NOBF$_4$), nitrosyl sulfuric acid (NOHSO$_4$), or combinations thereof may be used as the nitrosyl compound.

The phosphoric acid-based inorganic acid refers to an inorganic acid containing a phosphite group (HPO$_3^{2-}$) or a phosphate group (PO$_4^{3-}$), and may be phosphoric acid (H$_3$PO$_4$) as a non-limiting example.

In addition, the organic acid may be acetic acid, citric acid, succinic acid, glutaric acid, adipic acid, pimelic acid, suberic acid, malic acid, tartaric acid, lactic acid, propionic acid, caproic acid, caprylic acid, phenylacetic acid, benzoic acid, benzene monocarboxylic acid, nitrobenzoic acid, hydroxybenzoic acid, hydroxybenzene, aminobenzoic acid, diacetic acid, pyruvic acid, gluconic acid, glycolic acid, iminodiacetic acid, nitrilotriacetic acid, ethylene diaminetetraacetic acid, ethylene trinitrile pentaacetic acid, alanine, glutamic acid, aminobutyric acid, glyciminodisuccinic acid, polyiminodisuccinic acid, oxalic acid, malonic acid, formic acid, or combinations thereof.

Specifically, the organic acid may be an acetic acid-based organic acid including an acetate group (CH$_3$COO$^-$), and more specifically, may be acetic acid (CH$_3$COOH).

The etchant composition for a silicon layer according to an embodiment may include 1 to 10 parts by weight of the fluoride-based compound, 5 to 20 parts by weight of the phosphoric acid-based inorganic acid, and 5 to 20 parts by weight of the organic acid based on 100 parts by weight of the nitrate-based compound. Specifically, the etchant composition for a silicon layer may include 1 to 5 parts by weight of the fluoride-based compound, 5 to 15 parts by weight of the phosphoric acid-based inorganic acid, and 10 to 20 parts by weight of the organic acid based on 100 parts by weight of the nitrate-based compound.

In addition, the nitrosyl compound may be included in an amount of 0.01 to 10 wt %, or 0.05 to 10 wt %, or 0.1 to 8 wt %, or 1 to 8 wt % based on the total weight of the etchant composition for a silicon layer. When the above-described range is satisfied, an etch rate for the silicon layer may be further improved, which is preferable, but the present disclosure is not necessarily limited thereto.

The etchant composition for a silicon layer according to an embodiment may have a high selectivity of the silicon layer (Si) to the silicon oxide layer (SiO$_2$). In addition, since the etchant composition for a silicon layer may be applied with an appropriate viscosity, an etch rate for the silicon layer (Si) is very remarkable due to smooth interaction with a surface of the silicon layer (Si).

Specifically, an etch rate for the silicon layer (Si) of the etchant composition for a silicon layer according to an embodiment may be 1 μm/min or more, 3 μm/min or more, or 5 μm/min or more, and specifically, 5 μm/min to 50 μm/min, 5 μm/min to 20 μm/min, or 8 μm/min to 20 μm/min. At the same time, an etch selectivity ($E_{Si}/E_{SiO2}$) of the silicon layer (Si) to the silicon oxide layer (SiO$_2$) of the etchant composition for a silicon layer according to an embodiment may be 400 or more, and specifically 400 to 1,000, 400 to 800, or 450 to 700, but is not necessarily limited thereto.

Hereinafter, an etching method using an etchant composition for a silicon layer according to an embodiment will be described in detail.

An etching method according to an embodiment may be a method of selectively etching a silicon layer with respect to a silicon oxide layer.

In addition, an embodiment provides a method of manufacturing a semiconductor element including an etching process of selectively etching a silicon layer with respect to a silicon oxide layer using the etchant composition for a silicon layer.

The silicon oxide layer is not limited as long as it is a silicon oxide layer generally used in the art, and may be, for example, one or more selected from the group consisting of a spin on dielectric (SOD) layer, a high density plasma (HDP) layer, a thermal oxide layer, a borophosphate silicate glass (BPSG) layer, a phospho silicate glass (PSG) layer, a boro silicate glass (BSG) layer, a polysilazane (PSZ) layer, a fluorinated silicate glass (FSG) layer, a low pressure tetra ethyl ortho silicate (LP-TEOS) layer, a plasma enhanced tetra ethyl ortho silicate (PETEOS) layer, a high temperature oxide (HTO) layer, a medium temperature oxide (MTO) layer, an undoped silicate glass (USG) layer, a spin on glass (SOG) layer, an advanced planarization layer (APL) layer, an atomic layer deposition (ALD) layer, a plasma enhanced (PE)-oxide layer, an O3-tetra ethyl ortho silicate (O3-TEOS) layer, and the like.

In addition, the method of selectively etching the silicon layer with respect to the silicon oxide layer using the etchant composition for a silicon layer described above may be performed according to a treatment method generally used in the art. As a non-restrictive example, the method may be performed according to a method of immersing a semiconductor substrate to be etched in the etchant composition for a silicon layer solution according to an embodiment, a spray method, or the like.

As an example, the method may be performed at a process temperature of 50° C. or less, specifically a process of temperature of 20 to 50° C., and more specifically at a process temperature of 25° C.

The method may selectively and quickly etch a silicon layer with respect to a silicon oxide layer and suppress the generation of precipitates when the silicon oxide layer, the silicon layer, a photoresist layer, and the like, formed on a substrate exist together.

Various materials such as silicon, quartz, glass, a silicon wafer, a polymer, a metal, and metal oxides may be used as a material of the substrate, but the material of the substrate is not limited thereto. As an example of a polymer substrate, a film substrate such as polyethylene terephthalate, polycarbonate, polyimide, polyethylene naphthalate, or cycloolefin polymer may be used, but the polymer substrate is not limited thereto.

The silicon oxide layer, the silicon layer, and the photoresist layer may be formed as a single layer, a double layer, or a multiple-layer (multilayer layer), respectively, and in a case of the double layer or the multiple-layer, a stacking order is not limited.

In addition, the method of manufacturing a semiconductor element including an etching process of selectively etching a silicon layer using the etchant composition for a silicon layer described above may also be performed according to a method generally used in the art.

According to the method of manufacturing a semiconductor element, in a semiconductor element in which silicon oxide layers and silicon layers are alternately stacked or exist together, selective etching for the silicon layer is possible, and damage to the silicon oxide layer is effectively suppressed, such that damage to the silicon oxide layer due to the etching may be minimized, and thus, stability, efficiency, and reliability of a process of manufacturing a semiconductor element may be significantly improved. In this case, a type of the semiconductor element is not particularly limited in the present disclosure.

Accordingly, the etching method according to the present disclosure may selectively remove the silicon layer with respect to the silicon oxide layer, and may be efficiently applied to a process requiring the selective etching of the silicon layer.

Hereinafter, the above-described implementations will be described in more detail through Examples. However, the following Examples are only for the purpose of description and do not limit the scope of the present disclosure.

Examples 1 to 9 and Comparative Examples 1 to 4

Etchant compositions for a silicon layer were prepared in composition ratios (wt %) shown in Table 1, but the etchant compositions include water in amounts allowing their total weights to 100 wt %.

In Table 1, APS refers to ammonium persulfate.

TABLE 1

| | Hydrofluoric Acid | Nitric Acid | Phosphoric Acid | Acetic Acid | Oxidizing Aid Kind | Oxidizing Aid Content |
|---|---|---|---|---|---|---|
| Comparative Example 1 | 3.0 | 49.0 | — | 24.0 | — | — |
| Comparative Example 2 | 3.0 | 71.0 | — | 11.0 | — | — |
| Comparative Example 3 | 3.0 | 71.0 | — | 10.0 | $NOBF_4$ | 0.1 |
| Comparative Example 4 | 3.0 | 71.0 | 9.0 | 11.0 | — | — |
| Comparative Example 5 | 3.0 | 71.0 | 9.0 | 11.0 | APS | 0.1 |
| Example 1 | 3.0 | 71.0 | 9.0 | 11.0 | $NOBF_4$ | 0.1 |
| Example 2 | 3.0 | 71.0 | 9.0 | 11.0 | $NOBF_4$ | 3.0 |
| Example 3 | 3.0 | 71.0 | 9.0 | 11.0 | $NOBF_4$ | 5.0 |
| Example 4 | 3.0 | 71.0 | 9.0 | 11.0 | $NOPF_6$ | 0.1 |
| Example 5 | 3.0 | 71.0 | 9.0 | 11.0 | $NOPF_6$ | 3.0 |
| Example 6 | 3.0 | 71.0 | 9.0 | 11.0 | $NOPF_6$ | 5.0 |
| Example 7 | 3.0 | 71.0 | 9.0 | 11.0 | $NOHSO_4$ | 0.1 |
| Example 8 | 3.0 | 71.0 | 9.0 | 11.0 | $NOHSO_4$ | 3.0 |
| Example 9 | 3.0 | 71.0 | 9.0 | 11.0 | $NOHSO_4$ | 5.0 |

Evaluation Example

Evaluation 1. Etch Rate and Etch Selectivity

As specimens, silicon wafers on which silicon oxide ($SiO_2$) layers were deposited and p-type silicon wafers were cut into a size of 20 mm×30 mm and used.

Beaker containers of a double jacket was filled with 100 g of silicon etchants prepared in Examples and Comparative Examples, a temperature was adjusted to 25° C. using a constant temperature circulation bath, and an etching process was then performed on the prepared evaluation specimens for a predetermined time. Additionally, stirring was performed at a speed of about 300 rpm using a magnetic stirrer during the etching process. The etched specimens were rinsed for about 30 seconds using ultrapure water and then dried with nitrogen at a pressure of 3.0 kgf/cm². Etch rates of the specimens were as represented in Equation 1, and thicknesses of silicon layers before and after the etching process were compared with each other and converted into and expressed as etch rates per minute. The thicknesses of the silicon layers were measured using a Spectroscopic Ellipsometer M-2000.

Etch rate (μm/min)=(Thickness before etching−Thickness after etching)/Processing time    Equation 1

TABLE 2

| | Etch rate (μm/min) Si | Etch rate (μm/min) $SiO_2$ | Etch selectivity ($Si/SiO_2$) |
|---|---|---|---|
| Comparative Example 1 | 4.4 | 0.09 | 49.4 |
| Comparative Example 2 | 6.2 | 0.05 | 126.5 |
| Comparative Example 3 | 7.3 | 0.05 | 152.1 |
| Comparative Example 4 | 5.4 | 0.03 | 192.9 |
| Comparative Example 5 | 5.6 | 0.03 | 193.1 |
| Example 1 | 8.4 | 0.02 | 466.7 |
| Example 2 | 9.0 | 0.02 | 529.4 |
| Example 3 | 9.8 | 0.02 | 576.5 |
| Example 4 | 8.3 | 0.02 | 461.1 |
| Example 5 | 9.2 | 0.02 | 484.2 |

TABLE 2-continued

|  | Etch rate (μm/min) | | Etch selectivity |
|---|---|---|---|
|  | Si | SiO$_2$ | (Si/SiO$_2$) |
| Example 6 | 9.9 | 0.02 | 521.1 |
| Example 7 | 8.6 | 0.02 | 452.6 |
| Example 8 | 9.8 | 0.02 | 544.4 |
| Example 9 | 10.3 | 0.02 | 605.9 |

Referring to Table 2, it can be seen that all of etchant compositions for a silicon layer according to the present disclosure implement a very excellent etch selectivity of a silicon layer to a silicon oxide layer.

The etchant composition for a silicon layer according to the present disclosure may implement a very excellent etch selectivity of the silicon layer to the silicon oxide layer. Accordingly, when the etchant composition for a silicon layer according to the present disclosure is used, only the silicon layer may be selectively etched without damaging a metal element adjacent to a boundary between an insulating layer such as the silicon oxide layer and the silicon layer.

The present disclosure has been described hereinabove by specific matters and exemplary embodiments, but these specific matters and exemplary embodiments have been provided only in order to assist in a more general understanding of the present disclosure. Therefore, the present disclosure is not limited to these exemplary embodiments, and various modifications and alterations may be made from this description by those skilled in the art to which the present disclosure pertains.

Therefore, the spirit of the present disclosure should not be limited to these exemplary embodiments, but the claims and all of modifications equal or equivalent to the claims are intended to fall within the scope and spirit of the present disclosure.

The invention claimed is:

1. An etchant composition for a silicon layer comprising: a fluoride-based compound; a nitrate-based compound; an acid mixture including a phosphoric acid-based inorganic acid and an organic acid; and a nitrosyl compound, wherein the nitrate-based compound is included in an amount of 70 wt % to 90 wt % based on a total weight of the etchant composition for the silicon layer, and wherein the etchant composition is for etching Si in a film where SiO$_2$ and Si exist together.

2. The etchant composition for a silicon layer of claim 1, wherein the etchant composition for a silicon layer includes 1 to 10 parts by weight of the fluoride-based compound, 5 to 20 parts by weight of the phosphoric acid-based inorganic acid, and 5 to 20 parts by weight of the organic acid based on 100 parts by weight of the nitrate-based compound.

3. The etchant composition for a silicon layer of claim 2, wherein the nitrosyl compound is included in an amount of 0.01 to 10 wt % based on the total weight of the etchant composition for a silicon layer.

4. The etchant composition for a silicon layer of claim 1, wherein the fluoride-based compound is hydrofluoric acid (HF), ammonium bifluoride (NH$_4$HF$_2$), ammonium fluoride (NH$_4$F), sodium fluoride (NaF), potassium fluoride (KF), aluminum fluoride (AlF$_3$), fluorboric acid (HBF$_4$), sodium bifluoride (NaHF$_2$), potassium bifluoride (KHF$_2$), ammonium tetrafluoroborate (NH$_4$BF$_4$), or combinations thereof.

5. The etchant composition for a silicon layer of claim 1, wherein the nitrosyl is compound nitrosonium hexafluorophosphate (NOPF$_6$), nitrosyl tetrafluoroborate (NOBF$_4$), nitrosyl sulfuric acid (NOHSO$_4$), ruthenium (III) nitrosyl chloride (Ru(NO)Cl$_3$), nitrosyl chloride (NOCl), nitronium tetrafluoroborate (NO$_2$BF$_4$), nitronium hexafluorophosphate (NO$_2$PF$_6$), nitronium hydrogen sulfate (NO$_2$HSO$_4$), or combinations thereof.

6. The etchant composition for a silicon layer of claim 1, wherein the nitrate-based compound is nitric acid (HNO$_3$), peroxynitric acid (HNO$_4$), or combinations thereof.

7. The etchant composition for a silicon layer of claim 6, wherein the nitric acid is high concentration nitric acid having a concentration of 68% or more.

8. The etchant composition for a silicon layer of claim 1, wherein an etch rate for the silicon layer (Si) is 5 μm/min or more.

9. The etchant composition for a silicon layer of claim 8, wherein an etch selectivity of the silicon layer (Si) to a silicon oxide layer (SiO$_2$) is 400 or more.

10. An etching method of selectively etching a silicon layer with respect to a silicon oxide layer using the etchant composition for a silicon layer of claim 1.

11. A method of manufacturing a semiconductor element comprising an etching process performed using the etchant composition for a silicon layer of claim 1.

* * * * *